*(12)* United States Patent
Huberman et al.

(10) Patent No.: US 11,402,233 B2
(45) Date of Patent: Aug. 2, 2022

(54) MAINTAINING A TRAINED NEURAL NETWORK IN MAGNETIC FINGERPRINT BASED INDOOR NAVIGATION

(71) Applicant: MAPSTED CORP., Mississauga (CA)

(72) Inventors: Sean Huberman, Guelph (CA); Henry L. Ohab, Toronto (CA)

(73) Assignee: MAPSTED CORP., Mississauga (CA)

( * ) Notice: Subject to any disclaimer, the term of this patent is extended or adjusted under 35 U.S.C. 154(b) by 285 days.

(21) Appl. No.: 16/519,617

(22) Filed: Jul. 23, 2019

(65) Prior Publication Data

US 2021/0025732 A1 Jan. 28, 2021

(51) Int. Cl.
| | |
|---|---|
| *G01C 21/20* | (2006.01) |
| *G01C 25/00* | (2006.01) |
| *G01R 33/10* | (2006.01) |
| *G06N 3/08* | (2006.01) |
| *H04W 4/33* | (2018.01) |
| *H04W 4/024* | (2018.01) |

(52) U.S. Cl.
CPC ............ *G01C 25/00* (2013.01); *G01C 21/206* (2013.01); *G01R 33/10* (2013.01); *G06N 3/08* (2013.01); *H04W 4/024* (2018.02); *H04W 4/33* (2018.02)

(58) Field of Classification Search
CPC ...... G01C 25/00; G01C 21/206; G01C 21/08; G01R 33/02; G01R 33/10; G06N 3/0445; G06N 3/0454; G06N 20/00; H04W 4/024; H04W 4/33
USPC .................................... 702/94, 141, 150, 188
See application file for complete search history.

(56) References Cited

U.S. PATENT DOCUMENTS

| | | | | |
|---|---|---|---|---|
| 5,355,313 | A * | 10/1994 | Moll | ........................ G01V 3/38 702/2 |
| 6,539,327 | B1 | 3/2003 | Dassot et al. | |
| 9,170,112 | B2 | 10/2015 | Mirov et al. | |
| 9,557,178 | B2 | 1/2017 | Ghose et al. | |
| 2009/0043504 | A1* | 2/2009 | Bandyopadhyay | ..... G01S 19/48 701/469 |
| 2013/0150076 | A1 | 6/2013 | Kim et al. | |
| 2013/0162481 | A1 | 6/2013 | Parvizi et al. | |

(Continued)

OTHER PUBLICATIONS

Wang, X., et al., "CiFi: Deep Convolutional Neural Networks for Indoor Localization with 5GHz Wi-Fi," IEEE 2017 International Conference on Communications, SAC Symposium Big Data Networking Track, May 21-25, 2017, pp. 1-6. (Year: 2017).*

(Continued)

*Primary Examiner* — Jeffrey P Aiello

(57) ABSTRACT

A method and system of maintaining a trained neural network for mobile device indoor navigation and positioning. The method comprises receiving a set of magnetic measured parameters acquired at a mobile device positioned at a first location of an indoor area; computing, at an output layer of a trained neural network, an output error based on comparing a magnetic input feature in accordance with the magnetic measured parameters to a magnetic output feature generated at the output layer, the magnetic output feature being generated at least in part based on a matrix of weights associated with at least a first neural network layer; and if the output error exceeds a threshold value, re-training the neural network based at least in part upon re-initializing the matrix of weights associated with the at least a first neural network layer.

20 Claims, 5 Drawing Sheets

(56) References Cited

U.S. PATENT DOCUMENTS

| | | | |
|---|---|---|---|
| 2014/0180627 A1 | 6/2014 | Naguib et al. | |
| 2015/0018018 A1 | 1/2015 | Shen et al. | |
| 2016/0011022 A1 | 1/2016 | Zheng et al. | |
| 2016/0379074 A1 | 12/2016 | Nielsen et al. | |
| 2017/0000553 A1* | 1/2017 | Wiener | A61B 18/1233 |
| 2017/0265041 A1 | 9/2017 | Mahasenan et al. | |
| 2018/0274931 A1* | 9/2018 | Noethlings | G01C 21/08 |
| 2018/0356475 A1 | 12/2018 | Eitel et al. | |
| 2019/0171935 A1* | 6/2019 | Agrawal | G06N 3/0445 |
| 2019/0271547 A1* | 9/2019 | Young | G01S 19/13 |
| 2020/0117997 A1* | 4/2020 | Yao | G06N 3/0635 |
| 2020/0211359 A1* | 7/2020 | Shoari | H04M 1/0262 |
| 2020/0271747 A1* | 8/2020 | Wu | G01P 15/18 |
| 2020/0302510 A1* | 9/2020 | Chachek | G06K 9/00671 |

OTHER PUBLICATIONS

Dai et al., Multi-layer neural network for received signal strength-based indoor localization, IET Communications (vol. 10 ,Issue: 6 , Apr. 14, 2016), Apr. 14, 2016.

Rahman et al., RSS-Based Indoor Localization Algorithm for wireless sensor network using Generalized Regression Neural Network, Arabian Journal for Science and Engineering, Jun. 2012, vol. 37, Issue 4, pp. 1043-1053.

* cited by examiner

300

Generate a magnetic infrastructure profile of at least a portion of the indoor area
310

Determine, in the processor, a magnetic field profile based on the magnetic infrastructure profile
320

Generate an association of magnetic field profile parameters associated with respective locations within the indoor area as the magnetic fingerprint map
330

400

Determine, in the processor, at a plurality of locations, a set of magnetic input parameters in accordance with a magnetic infrastructure profile of at least a portion of an indoor area, the processor implementing an input layer of a neural network, the set of magnetic input parameters providing a magnetic feature input to the input layer of the neural network
410

Receive, from a mobile device positioned at the first location, a set of measured magnetic parameters at respective ones of the plurality of locations
420

Compute, at an output layer of the neural network implemented by the processor, an error matrix based on comparing an initial matrix of weights associated with the at least a first neural network layer representing the magnetic feature input to a magnetic feature output in accordance with the magnetic measured parameters of the mobile device
430

Recursively adjust the initial weights matrix by backpropogation to diminish the error matrix until the generated magnetic feature output matches the magnetic measured parameters
440

Receive a set of magnetic measured parameters acquired at a mobile device positioned at a first location of an indoor area
510

Compute, at an output layer of a trained neural network, an output error based on comparing a magnetic input feature in accordance with the magnetic measured parameters to a magnetic output feature generated at the output layer, the magnetic output feature being generated at least in part based on a matrix of weights associated with at least a first neural network layer
520

If the output error exceeds a threshold value, re-train the neural network based at least in part upon re-initializing the matrix of weights associated with the at least a first neural network layer.
530

FIG. 5

MAINTAINING A TRAINED NEURAL NETWORK IN MAGNETIC FINGERPRINT BASED INDOOR NAVIGATION

TECHNICAL FIELD

The disclosure herein relates to the field of magnetic fingerprint data for mobile device indoor navigation and positioning.

BACKGROUND

Users of mobile devices are increasingly using and depending upon indoor positioning and navigation applications and features. Seamless, accurate and dependable indoor positioning can be difficult to achieve using satellite-based navigation systems when the latter becomes unavailable or sporadically available, such as within enclosed or partly enclosed urban infrastructure and buildings, including hospitals, shopping malls, airports, universities and industrial warehouses. To address this problem, indoor navigation solutions increasingly rely on sensors such as accelerometers, gyroscopes, and magnetometers which are commonly included in mobile phones and similar mobile devices. Magnetic field data, wireless communication signal data, ambient barometric data, and mobile device inertial data when applied in localizing a mobile device along a route traversed within indoor infrastructure typically requires time consuming, error-prone and expensive manual calibration efforts to generate and maintain a positioning fingerprint map, or fingerprint database, of the indoor area.

BRIEF DESCRIPTION OF THE DRAWINGS

FIG. 4 illustrates, in an example embodiment, a method of magnetic fingerprint based neural network training for mobile device indoor navigation and positioning.

FIG. 5 illustrates, in an embodiment, a method of maintenance with re-training of a trained neural network used in conjunction with a magnetic fingerprint database.

DETAILED DESCRIPTION

Figure 1:
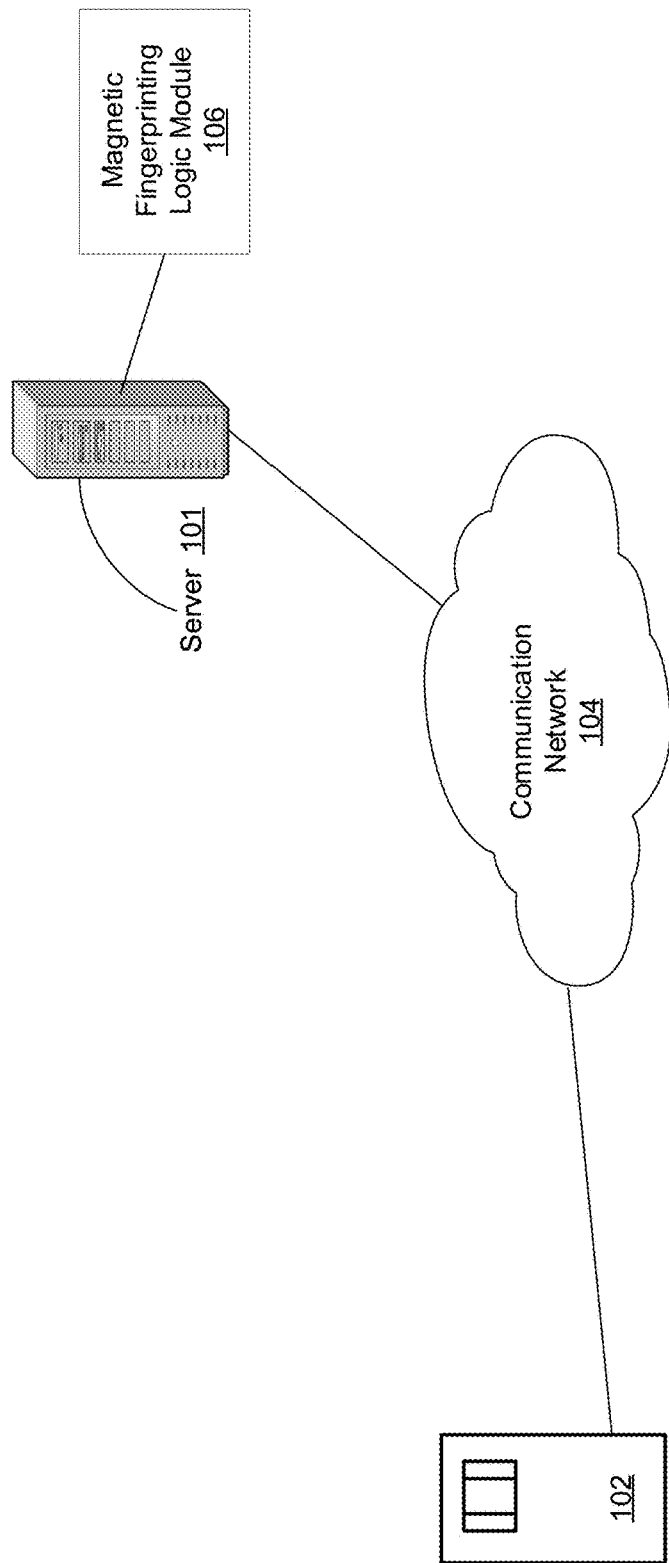
FIG. 1 illustrates, in an example embodiment, a magnetic fingerprinting system for mobile device indoor navigation and positioning.

Among other benefits, the disclosure herein provides for a location magnetic fingerprinting methodology and a method of maintenance with re-training of a trained neural network used in conjunction with a magnetic fingerprint database for mobile device indoor navigation. In embodiments, the method and system herein uses all three components of the measured magnetic field vectors to improve magnetic fingerprinting accuracy, and therefore overall accuracy for mobile device indoor navigation.

By applying a postulated mathematical model of magnetic characteristics, a resultant magnetic fingerprint representation that requires only minimal, if any, manual calibration may be generated in accordance with the postulated mathematical magnetic model ("magnetic model" as referred to herein).

The method and system disclosed herein allows for magnetic parameter estimates of magnetic distortion areas that were not manually mapped. Additionally, after fingerprint mapping the area, it can be determined approximately how strong the estimated magnetic disturbances within the area are. For example, considerations related to density of the disturbed regions, and whether there many areas that appear to be unperturbed. Knowledge of the density of magnetic regions within the area can influence whether the specific building is a good candidate for magnetic field calibration or not. In particular, if the anticipated magnetic spread is not significant, then a given building may not benefit from the more intensive magnetic calibration and processing.

Provided is a method of a method and system of neural network training for magnetic fingerprinting for mobile device indoor navigation and positioning. The method, executed in a processor of a server computing device, comprises receiving a set of magnetic measured parameters acquired at a mobile device positioned at a first location of an indoor area; computing, at an output layer of a trained neural network, an output error based on comparing a magnetic input feature in accordance with the magnetic measured parameters to a magnetic output feature generated at the output layer, the magnetic output feature being generated at least in part based on a matrix of weights associated with at least a first neural network layer; and if the output error exceeds a threshold value, re-training the neural network based at least in part upon re-initializing the matrix of weights associated with the at least a first neural network layer.

Also provided is a server computing system for neural network training in magnetic fingerprinting for mobile device indoor navigation and positioning. The server computing system comprises a processor and a memory. The memory includes instructions executable in the processor to receive a set of magnetic measured parameters acquired at a mobile device positioned at a first location of an indoor area; compute, at an output layer of a trained neural network, an output error based on comparing a magnetic input feature in accordance with the magnetic measured parameters to a magnetic output feature generated at the output layer, the magnetic output feature being generated at least in part based on a matrix of weights associated with at least a first neural network layer; and if the output error exceeds a threshold value, re-train the neural network based at least in part upon re-initializing the matrix of weights associated with the at least a first neural network layer.

The terms localize, or localization, as used herein refer to determining a unique coordinate position of the mobile device at a specific location along a route being traversed relative to the indoor area or building. In some embodiments, localization may also include determining a floor within the building, and thus involve determining not only horizontal planar (x, y) coordinates, but also include a vertical, or z, coordinate of the mobile device, the latter embodying a floor number within a multi-floor building or multi-level building, for example. In other embodiments, the (x, y, z) coordinates may be expressed either in a local reference frame specific to the mobile device, or in accordance with a global coordinate reference frame.

The indoor area may be any one or a combination of a manufacturing facility, a shopping mall, a warehouse, an airport facility, a hospital facility, a university campus facility or any at least partially enclosed building.

One or more embodiments described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Furthermore, one or more embodiments described herein may be implemented through the use of logic instructions that are executable by one or more processors. These instructions may be carried on a computer-readable medium. In particular, machines shown with embodiments herein include processor(s) and various forms of memory for storing data and instructions. Examples of computer-readable mediums and computer storage mediums include portable memory storage units, and flash memory (such as carried on smartphones). An embedded device as described herein utilizes processors, memory, and logic instructions stored on computer-readable medium. Embodiments described herein may be implemented in the form of computer processor-executable logic instructions or programs stored on computer memory mediums.

System Description

FIG. 1 illustrates, in an example embodiment, magnetic fingerprinting system 100 for mobile device indoor navigation and positioning, including mobile device 102. Mobile device 102 may include a processor, memory and associated circuitry to accomplish any one or more of telephony, data communication, and data computing. Mobile device 102 may be in communication with server computing device via communication network 104. In other variations, mobile device 102 may be connected within a computer network communication system 104, including the internet or other wide area network, to remote server computing device 101 that stores, in a fingerprint database, the fingerprint data of the pedestrian area, the latter being communicatively accessible to mobile device 102 for download of the fingerprint data.

Mobile device 102 may include magnetic characteristics sensor functionality by way of one or more magnetometer devices, in addition to inertial sensors such as an accelerometer and a gyroscope, barometric or other ambient pressure sensing functionality, humidity sensor, thermometer, and ambient lighting sensors such as to detect ambient lighting intensity and wireless signal strength sensors. Magnetic parameters sensed, whether directly or as calculated using one or more processors of mobile device 102 may include magnetic field strength, magnetic dip angle, and a magnetic field direction. The magnetic field in some embodiments may be detected, measured and rendered in accordance with separate x, y, and z-component vectors that constitute the magnetic field. Mobile device 102 may include location determination capability by way of a GPS module having a GPS receiver, and a communication interface for communicatively coupling to communication network 104, including by sending and receiving cellular data over data and voice channels.

A fingerprint data repository, or a portion(s) thereof, may be stored in server computing device 101 (also referred to herein as server 101) and made communicatively accessible to mobile device 102 via communication network 104. Server 101 may include magnetic fingerprinting logic module 106 comprised of instructions executable in a processor of server device 101, for use in conjunction with the fingerprint data repository that includes RSS fingerprint data. In some embodiments, it is contemplated that the fingerprint data repository, or any portions of data and processor-executable instructions constituting the fingerprint data repository, may be downloaded for storage, at least temporarily, within a memory of mobile device 102. In embodiments, the fingerprint map data stored in the fingerprint data repository further associates particular positions along pedestrian route of the manufacturing facility or indoor area with a particular combination of time-stamped fingerprint data, including gyroscope data, accelerometer data, wireless signal strength data, wireless connectivity data, magnetic data, barometric data, acoustic data, line-of sight data, and ambient lighting data stored thereon.

The terms fingerprint and fingerprint data as used herein refer to time-correlated, time-stamped individual measurements of any of, or any combination of, received wireless communication signal strength and signal connectivity parameters, magnetic field parameters (strength, direction) or barometric pressure parameters, and mobile device inertial sensor data at known, particular locations along a route being traversed, and also anticipated for traversal, by the mobile device. In other words, a fingerprint as referred to herein may include a correlation of sensor and signal information (including, but not necessarily limited to wireless signal strength, wireless connectivity information, magnetic or barometric information, inertial sensor information and GPS location information) associated for a unique location relative to the facility in accordance with a particular time stamp of gathering the set of mobile sensor data by time correlating the mobile device gyroscope data, the mobile device accelerometer data, mobile device magnetometer data and any other applicable mobile device sensor data, for example. Thus, fingerprint data associated with a particular location or position may provide a fingerprint signature that uniquely correlates to that particular location or position. A sequence of positions or locations that constitute a navigation path traversed by the mobile device relative to a given indoor facility may be fingerprint-mapped during a calibration process, and the resulting fingerprint map stored in a fingerprint data repository of server 101. Server 101 may store respective fingerprint maps of various buildings and indoor areas. The respective building or indoor facility fingerprint maps, or any portions thereof, may be downloaded into a memory of mobile device 102 for use in conjunction with the pedestrian navigation software application executing thereon.

The magnetic characteristics of the earth's magnetic field may vary in different zones of a given building given the presence of steel structural elements, ferromagnetic objects and the electronic equipment typically contained there. Such elements perturb the earth's magnetic field which may provide the potential for distinguishing unique locations or positions inside the buildings. In general, a non-uniform indoor ambient magnetic field produces different magnetic observations depending on the path taken through it. Static objects or infrastructures inside buildings, such as steel structures, electric power systems and electronic and mechanical appliances, perturb the earth's magnetic field in a manner that establishes a profile of magnetic field values that constitute a map composed of magnetic field fingerprints. Certain elements inside buildings can distort or attenuate the relatively weak direction of the earth's magnetic field. Magnetic field perturbation as sensed or measured at a given location within the building may decrease rapidly as the distance from an interfering source increases. The size of the object responsible for the interference has a direct impact on the perturbation generated. More specifically, the larger the object, the greater the distance needed for the perturbation to decrease.

Figure 2:
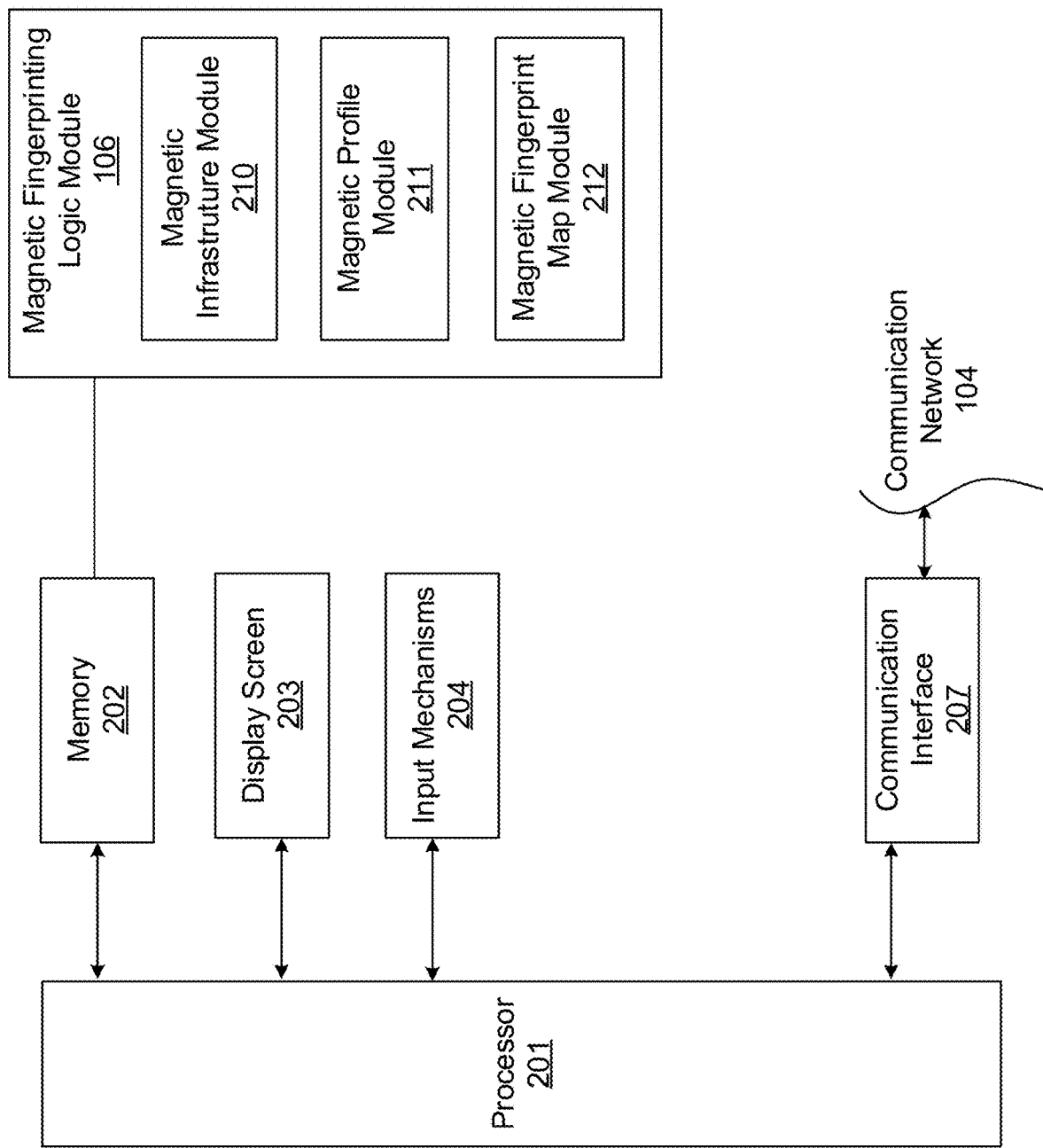
FIG. 2 illustrates, in one example embodiment, an architecture of a server computer implementing a magnetic fingerprinting system for mobile device indoor navigation and positioning.

FIG. 2 illustrates, in one example embodiment, an architecture of a server computer 101 implementing a magnetic fingerprinting system for mobile device indoor navigation and positioning. Server 101, in embodiment architecture 200, may be implemented on one or more server devices, and includes processor 201, memory 202 which may include a read-only memory (ROM) as well as a random access memory (RAM) or other dynamic storage device, display device 203, input mechanisms 204 and communication interface 207 communicatively coupled to communication network 104. Processor 201 is configured with software and/or other logic to perform one or more processes, steps and other functions described with implementations, such as described by FIGS. 1-3 herein. Processor 201 may process information and instructions stored in memory 202, such as provided by a random access memory (RAM) or other dynamic storage device, for storing information and instructions which are executable in processor 201. Memory 202 also may be used for storing temporary variables or other intermediate information during execution of instructions to be executed by processor 201. Memory 202 may also include the ROM or other static storage device for storing static information and instructions for processor 201; a storage device, such as a magnetic disk or optical disk, may be provided for storing information and instructions. Communication interface 207 enables server 101 to communicate with one or more communication networks 104 (e.g., a cellular network) through use of the both wired and wireless network links. Using the network link, server 101 can communicate with Mobile device 102.

Magnetic fingerprinting logic module 106 of server 101 may include executable instructions comprising sub-modules magnetic infrastructure module 210, magnetic profile module 211, and magnetic fingerprint map module 212

Processor 201 uses executable instructions of magnetic infrastructure module 210 to generate a magnetic infrastructure profile of at least a portion of the indoor area.

Processor 201 uses executable instructions stored in magnetic profile module 211 to determine a magnetic field profile based on the magnetic infrastructure profile.

Processor 201 uses executable instructions stored in magnetic fingerprint map module 212 to generate an association of magnetic field profile parameters associated with respective locations within the indoor area as the magnetic fingerprint map.

Methodology

Figure 3:
FIG. 3 illustrates, in an example embodiment, a method of magnetic fingerprinting system for mobile device indoor navigation and positioning.
Figure 3:

FIG. 3 illustrates, in an example embodiment, method 300 of magnetic fingerprinting for mobile device indoor navigation and positioning. In describing examples of FIG. 3, reference is made to the examples of FIGS. 1-2 for purposes of illustrating suitable components or elements for performing a step or sub-step being described.

An assumption, in an embodiment of the present invention, is that the dominant source of indoor magnetic field deviations is caused by the magnetization of lengthy ferromagnetic elements (LFME), for example, steel beams, reinforcement rods in concrete walls/slabs, pipes, support columns, etc. In particular, an architectural floorplan provides a mapping of the locations of walls, doors, support columns, etc. As such, by applying mathematical models directly to the floorplan, an estimate of the inferred magnetic field can be developed.

More specifically, a single LFME gives off a magnetic field to its surrounding space. The magnetic field can be approximated by that of two single magnetic changes placed at both ends of the LFME opposite in sign but equal in magnitude. In particular, as the rod gets longer, the strength of the "side" magnetic fields gets weaker. Hence, for very long rods, it can be well-approximated by two separate magnetic charges on either end.

Different indoor objects can give off different magnetic effects. Some examples include: walls with iron rods, support beams, elevators, escalators, metal detectors (e.g., at entrances of stores in shopping centre). Hence, the magnetic charge, M, will be different depending on what type of object it is.

Based on the floor plan, we can identify a set of lines or polygons (e.g., identify a polygon as a room with walls or as an elevator). Classification of these elements can be based on manual labeling or utilizing an imagine processing technique (e.g., Support Vector Machines (SVM), Speeded-Up Robust Features (SURF), or Histograms of Orientated Gradients (HOG)).

Once each potential source of magnetic interference is classified, magnetic potentials can be assigned to each type. For example, $M_1$ for walls, $M_2$ for elevators, $M_3$ for escalators, . . . .

Default values for $M_1$, $M_2$, $M_3$, . . . can be used initially. Then, in conjunction with some calibration, a self-learning process can be used to refine the initial values and adjust them based on the observed data. This can be done by solving an optimization problem which attempts to minimize the difference between the mathematical model and the observed measured data during the calibration. The result is an empirically derived model of the magnetic field in a given building.

Hence, by processing the floorplan to extract out key vertices/edges representative of walls containing LFMEs, the location of the approximate magnetic charges can be estimated as the vertices of the floorplan. In particular, areas where two LFMEs intersect while result in the effects of two or more magnetic charges, depending the number of edge intersections.

While it is not possible to accurately determine the magnitude of the magnetic charges due to unknown spacing/diameter of the reinforced steel rods and due to the magnetic permeability of ferromagnetic materials, the magnetization should be proportional to the length (L), cross-sectional area (S), and the angle ($\alpha$) that the LFME makes with the geomagnetic field (i.e., proportional to LS cos α).

By georeferencing the floorplan, the geolocation of each line's endpoints (i.e., the vertices of the floorplan) can be determined, and hence, the angle that the LFME makes with the geomagnetic field can be estimated or approximated. Similarly, due to the georeferenced, the length of the LFME can be estimated or approximated.

The equations for the magnetic fields derive a vector (x,y,z) which represents the location (x,y) and the height (z) of the magnetic potential. Basically, the assumption is that the magnetic field created from a magnetic point charge is dissipated radially (getting weaker as you get further away). We can get a "magnetic strength" vector and direction from knowledge of the location of the magnetic point charge. When we look at the summation of all magnetic effects (i.e., each one has a direction and a magnitude), we can derive the "net" magnetic field at a particular point. If we consider the summation of the "z" component, that will be the magnetic fingerprint for the "vertical" magnetic field. Using the "x-y" components, we can estimate the horizontal component for the magnetic fingerprint. Using alternative approaches, the "x-y" component can be used to estimate the magnetic fingerprint in the "north" or "east" directions. This can also be used to estimate the expected direction of the magnetic field. This can be used in many different ways.

For example, in real-time, the current magnetic field captured by the phone (in local phone coordinates) can be converted into global coordinates using a rotation matrix (attitude tracker/orientation tracker). Then, we get the magnetic field strength in the (North, East, Down) directions. These values can be compared to the pre-estimated mathematical model to "update the values". The real-time (N, E, D) values may correspond to the summation of the estimated (x, y, z) from the mathematical model.

For the magnetic fingerprint map, we can keep track of many different reasonable things, depending on the embodiment. For example: the full vector (N, E, D). Or just the vertical component ("D"), or the vertical+horizontal (N-E). We can also look into the angle of the vector or the dip angle.

The magnetic field created by each magnetic charge, M, is radial and follows the inverse squares law. Specifically, it admits a magnetic potential of $P_0 = M/R$, where $R = \sqrt{x^2+y^2+z^2}$ is the distance between the magnetic charge and the observation point. Hence, the respective magnetic field:

$$\vec{F} = \nabla P_0 = M(x^2 + y^2 + z^2)^{-\frac{3}{2}} \cdot (\hat{x}, \hat{y}, \hat{z})^T.$$

The LFMEs are typically vertical or horizontal and oriented parallel to the walls where their ends (i.e., point charges) tend to intersect in one of the following ways: wall-wall, wall-ceiling, wall-floor, or doorway contours. For simplicity, refer to all these line intersections as end lines. Assuming the LFMEs in a parallel bundle are equally magnetized, then every end line will carry a uniformly distributed magnetic charge. For practical indoor scenarios, the generated magnetic fields at end lines are expected to represent short distances (i.e., l≪L), where the generated magnetic field will be cylindrical, symmetric, and proportional to $l^{-1}$.

For illustrative purposes, suppose that the coordinate system is chosen so that the LFME has ends at $$\left(-\frac{L}{2}, 0, 0\right) \text{ and } \left(\frac{L}{2}, 0, 0\right).$$

Then, the magnetic potential at an arbitrary point (x,y,z) is given by:

$$P_0(x, y, z) = \int_{-\frac{L}{2}}^{\frac{L}{2}} \frac{M}{\sqrt{(x-l)^2 + y^2 + z^2}} dl = M \ln \left[ \frac{\sqrt{x^2 + y^2 + z^2 - Lx + \frac{L^2}{4}} - x + \frac{L}{2}}{\sqrt{x^2 + y^2 + z^2 + Lx + \frac{L^2}{4}} - x - \frac{L}{2}} \right]$$

Hence, the magnetic potential is axially symmetric with respect to the X-axis.

The field strength $\vec{F} = \nabla P_0$. By applying the following definitions:

$$R = \sqrt{x^2+y^2+z^2}, V_{\pm} = \sqrt{R^2 \pm Ly + L^2/4}, W_{\pm} = \sqrt{R^2 \pm Lz + L^2/4},$$

The field strength can be expressed explicitly in the form:

$$F_x = 2M\left(\frac{1}{U_+} - \frac{1}{U_-}\right)$$

$$F_y = My \frac{V_-^{-1} - \left(V_- + \frac{L}{2} - x\right)V_+^{-1}}{V_- + \frac{L}{2} - x}$$

$$F_z = Mz \frac{W_-^{-1} - \left(W_- + \frac{L}{2} - x\right)W_+^{-1}}{W_- + \frac{L}{2} - x}$$

Note that the most significant end-lines will be the "T" or "V" shape intersections. In particular, "X" shape intersections will generate a field which is decreasing with distance at a rate of $1/R^2$ or faster. As such, for simplicity, "X" shape intersections can be ignored. Note that door end-points still provide a magnetic point charge.

In a more generalized universal coordinate frame, X'=(x', y',z'), the n-th charged line is given by:

$$X = Q^{(n)} X^{(n)} + B^{(n)}$$

The solution to the field strength $\vec{F} = (F_x, F_y, F_z)$ will be identical to the above where the variables are now expressed:

$$R'(X^{(n)}) = \sqrt{R^2 + (B^{(n)})^2 + 2(X^{(n)} B^{(n)})}$$

$$U'_{\pm}(X^{(n)}) = \sqrt{(R')^2 \pm L(q_{11}^{(n)} x^{(n)} + q_{11}^{(n)} y^{(n)} + q_{11}^{(n)} z^{(n)} + b_1^{(n)}) + \frac{L^2}{4}}$$

$$V'_{\pm}(X^{(n)}) = \sqrt{(R')^2 \pm L(q_{21}^{(n)} x^{(n)} + q_{21}^{(n)} y^{(n)} + q_{21}^{(n)} z^{(n)} + b_2^{(n)}) + \frac{L^2}{4}}$$

$$W'_{\pm}(X^{(n)}) = \sqrt{(R')^2 \pm L(q_{31}^{(n)} x^{(n)} + q_{31}^{(n)} y^{(n)} + q_{31}^{(n)} z^{(n)} + b_3^{(n)}) + \frac{L^2}{4}}$$

Even with no or only a minimal validation or correction, the mathematical model can be utilized to identify "danger zones" in which the mathematical model predicts anticipated strong magnetic disturbances. Hence, in real-time, as the user begins to approach a "danger zone", due to the anticipation of strong magnetic field, the use of magnetometer-based heading corrections (e.g., compass direction) can be ignored or applied with a significantly reduced weight and instead rely heavily on the gyroscope/accelerometer-based data within those regions. As such, the sensor fusion can be optimized according to the user's current multi-floor geographic location by incorporating knowledge from the mathematical models.

Examples of method steps described herein relate to the use of server device 101 for implementing the techniques described.

At step 310, processor 201 executes instructions included in magnetic infrastructure module 210 to generate a magnetic infrastructure profile of at least a portion of the indoor area.

In some embodiments, the indoor area may be such as a manufacturing facility, a shopping mall, a warehouse, an airport facility, a hospital facility, a university campus facility or an at least partially enclosed building.

In some embodiments, the magnetic infrastructure profile comprises at least one of a wall, a support column, an elevator, a fixedly located electronic equipment, a support beam, a stairwell, an escalator, a ceiling, and an electromechanical power plant.

In one aspect, the magnetic infrastructure profile comprises at least one of a steel structural element and a ferro-magnetic structural element.

At step 320, processor 201 executes instructions included in module 211 to determine a magnetic field profile based on the magnetic infrastructure profile.

In some embodiments, the magnetic field profile is determined in accordance with a postulated mathematical magnetic model.

In an embodiment, the postulated mathematical magnetic model includes at least a lengthy ferromagnetic element (LFME).

In another embodiment, the magnetic field profile parameters comprise a magnetic field strength.

In other variations, the magnetic field parameters comprise a magnetic dip angle.

In some embodiments, the magnetic field parameters comprise at least one of an x, y, z magnetic field vector component.

In other variations, the magnetic field parameters comprise a magnetic direction.

At step 330, processor 201 of server 101 executes instructions included in module 212 to generate an association of magnetic field profile parameters associated with respective locations within the indoor area as the magnetic fingerprint map.

FIG. 4 illustrates, in an example embodiment, a method 400 of neural network training in magnetic fingerprinting of an indoor area for mobile device navigation. In describing examples of FIG. 4, reference is made to the examples of FIGS. 1-3 for purposes of illustrating suitable components or elements for performing a step or sub-step being described.

In the particular embodiment of a convolution model, the convolution operation typically embodies two parts of inputs: (i) input feature map data, and (ii) a weight (also referred to as output filter, or kernel). Given the input channel data with W(Width)×H(Height)×IC data cube and R×S×IC filter, the output of direct convolution may be formulated as:

$$y_{w,h} = \sum_{r=0}^{R-1} \sum_{s=0}^{S-1} \sum_{c=0}^{C-1} x_{(w+r),(h+s),c} * W_{r,s,c}$$

where:
X=input data/input feature/input feature map
w=width of the input or output data
h=height of the input or output data
R=weight size (width)
S=weight size (height)
C=number of input channel
Y=output data/output feature/output feature map
W=filter/kernel/weight For each input channel, the filter, or weight, are convoluted with data and generates output data. The same location of data of all the input channels are summed together and generate 1 output data channel.

A weight is applied to detect a particular magnetic feature of the input map from an input data stream.

Each output channel of the convolution model is represented by an output filter or weight used to detect one particular feature or pattern of the input feature data stream. In convolution networks there may be many output filters or weights for each layer of the convolution model corresponding to respective features or patterns in the data stream of an input magnetic feature.

In some embodiments, the neural network is one of a recurrent neural network and a convolution neural network. In a convolution neural network, a first neural network layer may correspond to the set of magnetic input parameters for respective ones of a plurality of locations within the indoor area. In other embodiments, additional neural network layers may be applied for the magnetic parameters as determined.

At step 410, determine, in the processor, at a plurality of locations, a set of magnetic input parameters in accordance with a magnetic infrastructure profile of at least a portion of an indoor area, the processor implementing an input layer of a neural network, the set of magnetic input parameters providing a magnetic feature input to the input layer of the neural network.

At step 420, receive, from a mobile device positioned at the first location, a set of measured magnetic parameters at respective ones of the plurality of locations.

At step 430, compute, at an output layer of the neural network implemented by the processor, an error matrix based on comparing an initial matrix of weights associated with the at least a first neural network layer representing the magnetic feature input to a magnetic feature output in accordance with the magnetic measured parameters of the mobile device.

At step 440, recursively adjust the initial weights matrix by backpropagation to diminish the error matrix until the generated magnetic feature output matches the magnetic measured parameters.

In embodiments, the set of magnetic input parameters and the initial weights matrix are determined in the processor of the server computing device in accordance with execution of the magnetic infrastructure profile.

In one embodiment, the neural network is one of a recurrent neural network and a convolution neural network.

In another embodiment, the neural network comprises the convolution neural network, wherein the at least a first neural network layer corresponds to the set of magnetic input parameters for a magnetic field component.

In yet another embodiment, the method further comprises recursively adjusting the initial weights matrix as the error matrix is diminished until the generated magnetic feature output matches the magnetic measured parameters within a threshold percentage value of the magnetic measured parameters.

In another embodiment, the backpropagation comprises a backward propagation of errors in accordance with the error matrix as computed at the output layer, the errors being distributed backwards throughout the weights of the at least one neural network layer.

FIG. 5 illustrates, in an embodiment, method 500 of maintenance with re-training of a trained neural network used in conjunction with a magnetic fingerprint database. In describing examples of FIG. 5, reference is made to the examples of FIGS. 1-4 for purposes of illustrating suitable components or elements for performing a step or sub-step being described.

At step 510, receive a set of magnetic measured parameters acquired at a mobile device positioned at a first location of an indoor area.

At step 520, compute, at an output layer of a trained neural network, an output error based on comparing a magnetic input feature in accordance with the magnetic measured parameters to a magnetic output feature generated at the output layer, the magnetic output feature being generated at least in part based on a matrix of weights associated with at least a first neural network layer.

At step 530, if the output error exceeds a threshold value, re-train the neural network based at least in part upon re-initializing the matrix of weights associated with the at least a first neural network layer.

In an embodiment, re-initializing the matrix of weights comprises re-initializing the matrix of weights to a matrix of weights corresponding to the magnetic input parameters in accordance with a postulated magnetic model. Similar re-initialization conditions and techniques may be applied to other convolution layers of the convolution neural network that are used to model additional input features.

The threshold value of the output error may be predetermined or set to a value that corresponds to a significant deviation from the magnetic measured values acquired at the mobile device, for example, greater than 30% deviation from the measured values of the magnetic parameters acquired at the mobile device.

In another embodiment, where the mobile device is an Nth mobile device in a sequence of mobile devices (in which N represents a positive integer number of mobile devices in the sequence of mobile devices) for which the output error as computed is greater than the threshold value, the method may further comprise re-initializing the matrix of weights when the output error as computed for the sequence of devices including the Nth device exceeds the threshold value.

In some embodiments, the neural network is a convolution neural network, the weights matrix is a first weights matrix, and the method may further comprise re-initializing a second weights matrix that corresponds to the at least a second neural network layer of the convolution neural network.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no specific mention of the particular combination of features. Thus, the absence of describing combinations should not preclude the inventors from claiming rights to such combinations.

What is claimed is:

1. A method, executed in a processor of a server computing device, of maintaining a trained neural network for mobile device indoor navigation, the method comprising:

receiving a set of magnetic measured parameters acquired at a mobile device positioned at a first location of an indoor area;

computing, at an output layer of a trained neural network, an output error based on comparing a magnetic input feature in accordance with the set of magnetic measured parameters to a magnetic output feature generated at the output layer, the magnetic output feature being generated at least in part based on a matrix of weights associated with at least a first neural network layer representing the magnetic input feature to the magnetic output feature in accordance with the set of magnetic measured parameters; and if the output error exceeds a threshold value, re-training the neural network based at least in part upon re-initializing the matrix of weights associated with the at least a first neural network layer.

2. The method of claim 1 wherein re-initializing the matrix of weights comprises re-initializing the matrix of weights to a matrix of weights corresponding to magnetic input parameters in accordance with a magnetic infrastructure profile of at least a portion of the indoor area.

3. The method of claim 1 wherein the threshold value of the output error corresponds to at least 30% of the magnetic measured parameters acquired at the mobile device.

4. The method of claim 1 wherein the mobile device is an Nth mobile device in a sequence of mobile devices for which the output error as computed is greater than the threshold value, and further comprising re-initializing the matrix of weights when the output error as computed for the sequence of devices including the Nth device exceeds the threshold value.

5. The method of claim 1 wherein the set of magnetic input parameters are determined in the processor of the server computing device in accordance with execution of a postulated magnetic model in accordance with a magnetic infrastructure profile of at least a portion of the indoor area.

6. The method of claim 1 the magnetic infrastructure profile comprises at least one of a steel structural element and a ferro-magnetic structural element.

7. The method of claim 1 wherein the neural network is one of a recurrent neural network and a convolution neural network.

8. The method of claim 7 wherein the neural network comprises the convolution neural network, wherein the at least a first neural network layer corresponds to the set of magnetic input parameters for a magnetic field component.

9. The method of claim 1 wherein the set of magnetic measured parameters comprises a magnetic field strength.

10. The method of claim 1 wherein the set of magnetic measured parameters comprises a magnetic dip angle.

11. A server computing system for magnetic fingerprinting of an indoor area, the server computing system comprising:

a processor; and a memory including instructions executable in the processor to:

receive a set of magnetic measured parameters acquired at a mobile device positioned at a first location of an indoor area;

compute, at an output layer of a trained neural network, an output error based on comparing a magnetic input feature in accordance with the set of magnetic measured parameters to a magnetic output feature generated at the output layer, the magnetic output feature being generated at least in part based on a matrix of weights associated with at least a first neural network layer representing the magnetic input to the magnetic output in accordance with the set of magnetic measured parameters; and if the output error exceeds a threshold value, re-train the neural network based at least in part upon re-initializing the matrix of weights associated with the at least a first neural network layer.

12. The system of claim 11 wherein re-initializing the matrix of weights comprises re-initializing the matrix of weights to a matrix of weights corresponding to magnetic input parameters in accordance with a magnetic infrastructure profile of at least a portion of the indoor area.

13. The system of claim 11 wherein the threshold value of the output error corresponds to at least 30% of the magnetic measured parameters acquired at the mobile device.

14. The system of claim 11 wherein the mobile device is an Nth mobile device in a sequence of mobile devices for which the output error as computed is greater than the threshold value, and further comprising re-initializing the matrix of weights when the output error as computed for the sequence of devices including the Nth device exceeds the threshold value.

15. The system of claim 11 wherein the set of magnetic input parameters are determined in the processor of the server computing device in accordance with execution of a postulated magnetic model in accordance with a magnetic infrastructure profile of at least a portion of the indoor area.

16. The system of claim 15 the magnetic infrastructure profile comprises at least one of a steel structural element and a ferro-magnetic structural element.

17. The system of claim 11 wherein the neural network is one of a recurrent neural network and a convolution neural network.

18. The system of claim 17 wherein the neural network comprises the convolution neural network, wherein the at least a first neural network layer corresponds to the set of magnetic input parameters for a magnetic field component.

19. The system of claim 11 wherein the set of magnetic measured parameters comprises a magnetic field strength.

20. The system of claim 11 wherein the set of magnetic measured parameters comprises a magnetic dip angle.

* * * * *